United States Patent [19]

DiMaria et al.

[11] Patent Number: 4,472,726
[45] Date of Patent: Sep. 18, 1984

[54] TWO CARRIER DUAL INJECTOR APPARATUS

[75] Inventors: Donelli J. DiMaria, Ossining, N.Y.; Harish N. Kotecha, Manassas, Va.

[73] Assignee: The United States of America as represented by the Secretary of the Air Force, Washington, D.C.

[21] Appl. No.: 260,878

[22] Filed: May 6, 1981

[51] Int. Cl.³ .............................................. H01L 49/02
[52] U.S. Cl. .......................................... 357/6; 357/4; 357/54; 357/23.5; 365/94; 365/102
[58] Field of Search .................... 357/4, 6, 54, 23 VT; 365/94, 102

[56] References Cited

U.S. PATENT DOCUMENTS 4,104,675 8/1978 DiMaria et al. ...................... 357/54
4,217,601 8/1980 DeKeersmaecker et al. ......... 357/54

OTHER PUBLICATIONS

Frohman-Bentchkowsky et al., "Charge Transport and Storage in Metal-Nitride-Oxide-Silicon (MNOS) Structures", J. Appl. Phys., vol. 40, No. 8, pp. 3307-3319, Jul. 1969.

Primary Examiner—Martin H. Edlow
Assistant Examiner—William A. Mintel
Attorney, Agent, or Firm—Donald J. Singer; William Stepanishen

[57] ABSTRACT

A two carrier dual injector semiconductor apparatus utilizing a pair of injector gates for simultaneously injecting holes and electrons into a series stack of insulator layers. The stacked insulator layers which may be arranged in a MIM or MIS configuration have injecting layers near opposing metal gates for injecting either electrons as holes into the insulator layers depending upon the polarity of the applied bias voltage. The apparatus is capable of high-current low-voltage carrier injection while maintaining a stable trapped spaced charge within the stack of insulator layers.

6 Claims, 3 Drawing Figures

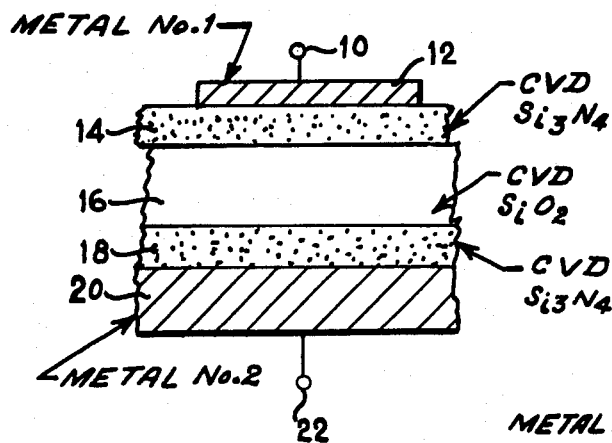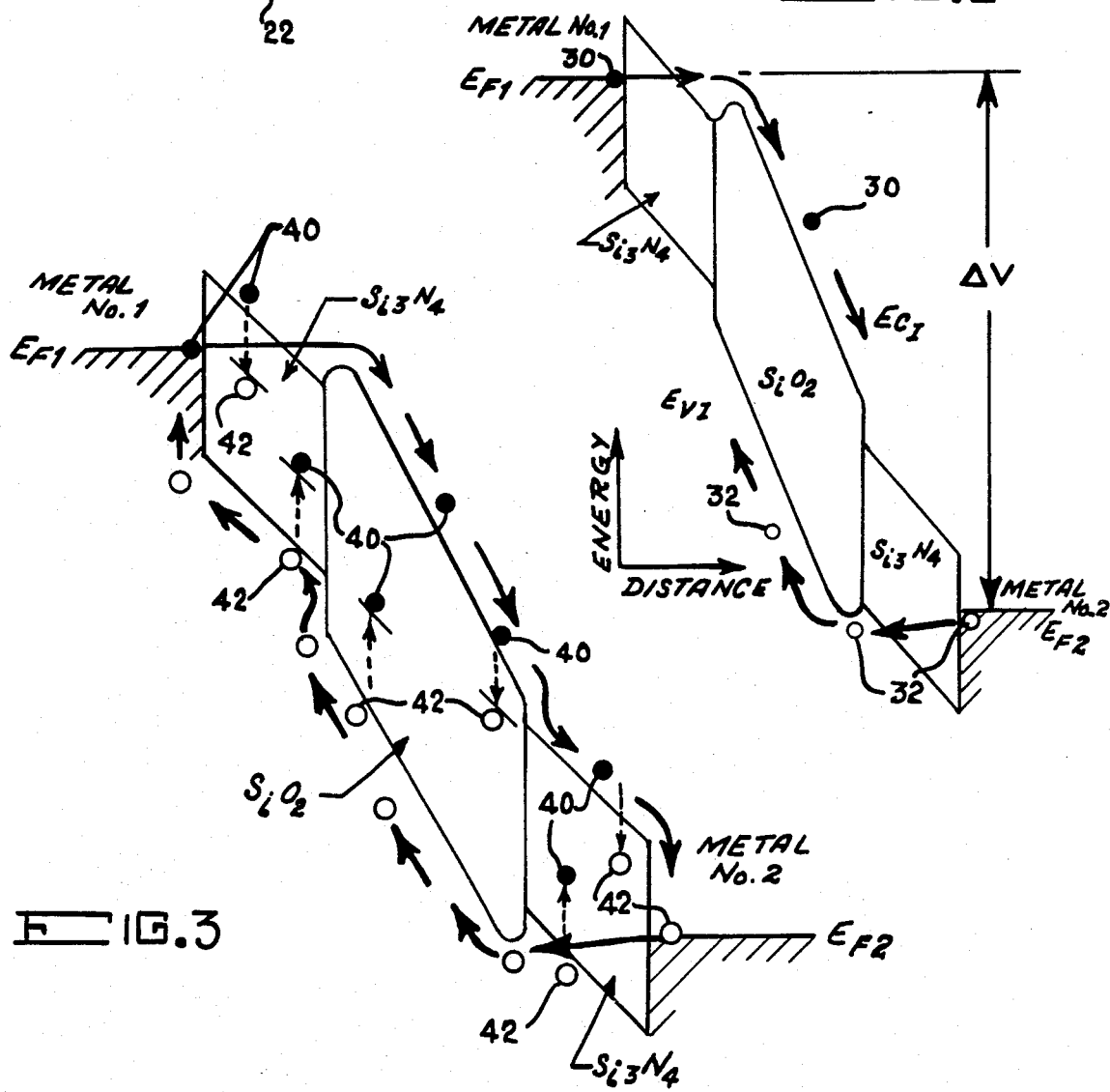

TWO CARRIER DUAL INJECTOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to semiconductor devices, and in particular to a two carrier dual injector semiconductor apparatus.

Non-volatile semiconductor memory devices which are particularly useful for electrically alterable read-only memories have been constructed in various structural configurations. One example of which is a metal-insulator-semiconductor (MIS) structure that is formed by stepping or grading the energy band gap near the metal gate electrode of the device. In a memory device using the MIS structure, either electrons or holes may be injected into the insulating layer with less applied voltage.

Other types of non-volatile memory structures and variations thereof include the floating-gate avalanche-injection metal-silicon dioxide-semiconductor (FAMOS) and metal-silicon nitride-silicon dioxide-semiconductor (MNOS) structures. The FAMOS memory structures are written into by hot electron injection from a silicon (Si) junction which is pulsed to the avalanche breakdown point. The memory structures may be read or erased rather slowly by using ultra-violet (UV) light to optically discharge the trapped electrons on the floating poly-Si storage layer in the device. Thus, it may be seen that FAMOS memory structures have these problems which limit the number of cycles that they can be operated through.

Metal-silicon nitride-silicon dioxide-semiconductor (MNOS) structures have also been utilized to provide non-volatile semiconductor memory devices. However, there is a problem with MNOS memory devices in that they suffer from wear-out, read perturb, and poor information retention. The wear-out mechanism occurs during the operation of the MNOS memory device when the nitride-oxide layer is charged and discharged a large number of times. The present apparatus provides a memory device wherein complete charging and discharging may be accomplished at will without being subject to wear-out.

SUMMARY OF THE INVENTION

The present invention utilizes a two carrier dual injector structure to simultaneously inject both electrons and holes into a metal-insulator metal (MIM) or metal-insulator-semiconductor (MIS) read-only memory device. The insulator in the read-only memory device comprises a series of stacked insulating layers which are arranged between a pair of opposing metal gates or contacts. The metal gates are oppositely biased to simultaneously inject both electron and holes into the memory device. The insulating layers may comprise alternating layers of chemical vapor deposition silicon nitride and silicon dioxide. The present two carrier dual injector apparatus is capable of high-current, low-voltage injection while maintaining a stable trapped space charge in the insulating layers.

It is one object of the present invention, therefore, to provide an improved non-volatile electrically-alterable memory apparatus.

It is another object of the invention to provide an improved non-volatile electrically-alterable memory apparatus utilizing a two carrier dual injector structure.

It is another object of the invention to provide an improved non-volatile electrically-alterable memory apparatus utilizing high-current, low-voltage charge injection.

It is yet another object of the invention to provide an improved non-volatile electrically-alterable memory apparatus to simultaneously inject election and holes into the memory apparatus.

It is a further object of the invention to provide an improved non-volatile electrically-alterable memory apparatus to maintain a stable trapped space charge within the memory structure.

These and other advantages, objects and features of the invention will become more apparent after considering the following description taken in conjunction with the illustrative embodiment in the accompanying drawings.

BRIEF DESCRIPTION OF THE DRAWINGS

FIG. 1 is a cross-sectional representation of a two carrier dual injector MOS apparatus according to the present invention, FIG. 2 is the energy band diagram of the MOS apparatus of FIG. 1, and, FIG. 3 is an energy band diagram illustrating carriers of one charge sign annihilating trapped charges of the other sign.

DESCRIPTION OF THE PREFERRED EMBODIMENT

Referring now to FIG. 1, there is shown a multi-layered metal-insulator-metal (MIM) semiconductor device. A first electrical contact 10 is connected to first metal gate 12 which may be appropriately biased to inject either electrons or holes into the first insulator material 14. In the present example, the first metal gate 12 may be comprised of any suitable metal, such as aluminum or any other such suitable material. A first insulator layer 14 is provided by any suitable means to form a metal-to-insulator interface. The first insulator layer 14 may be comprised of any well known insulator material such as chemical vapor deposition (CVD) silicon nitride, $Si_3N_4$, or any other such suitable insulator material. A base layer 16 of insulator material is provided to support a second insulator layer 18 which may be comprised of the same insulator material as the insulator layer 14 or another such suitable insulator material. The base layer 16 may be comprised of any well known suitable insulator material, such as, in the present example, chemical vapor deposition (CVD) silicon dioxide, $SiO_2$. A second metal gate 20 is provided to inject either electrons or holes, when appropriately biased, into insulator layers 18. A second electrical contact 22 is provided to allow the application of the desired voltage polarity to metal gate 20.

It may be seen that a series of stacked insulators in a MIM or MIS type configuration has been formed with an injecting layer near both contacts to provide a two carrier dual injector semiconductor device. The present apparatus is operated by simultaneously applying bias voltages of opposite polarity to the two injector gates 12, 20. Thus, the two carrier dual injector apparatus may inject either electrons or holes (depending on voltage polarity) at a particular gate when high currents at low voltages with a stable trapped space charge in the insulators is required. The semiconductor structure described herein is similar to a dual electron injector structure except that the injectors can efficiently inject either electrons or holes and not just electrons. An example of a two-carrier injector structure using a CVD $Si_3N_4$-CVD $SiO_2$-CVD $Si_3N_4$ stack is shown in FIG. 1. The advantage of the two carrier dual injector structure is that if a large number of write/erase cycles are required, the current injection efficiency should not change due to a trapped charge buildup in the insulating layers.

There is shown in FIG. 2 the energy band diagram for a two carrier dual injector structure wherein it is shown that if gate 12 which is metal number 1 is made negative, gates 12 will inject electrons 30 while gate 20 which is metal number 2 is simultaneously made positive, gate 20 will inject holes 32. It is known that CVD $Si_3N_4$ will transport effectively both electrons and holes, and its interface with CVD $SiO_2$ (which may be graded) has been shown to allow good electron and hole injection into the respective $SiO_2$ energy bands. A steady-state trapped charge situation will come about due to the fact that carriers of one sign will annihilate or compensate trapped charges of the other sign, this interaction between carriers is shown in FIG. 3.

In FIG. 3, there is shown an energy band diagram wherein carriers of one charge sign (electrons) are annihilating trapped charges of the opposite charge sign (holes) and visa versa. This interaction between the two charge carriers to eliminate or provide a stable steady-state trapped space charge within the device, will occur when metal number 1 is negatively biased to inject electrons 40 and metal number 2 is simultaneously biased positively to inject holes 42. Thus, it may be seen that as the electrons 40 from metal number 1 travel through the insulating layers $Si_3N_4$, $SiO_2$, $Si_3N_4$ to metal number 2, they will compensate or annihilate any holes 42 they encounter that were trapped in the insulating layers. The same interaction will occur with respect to the holes 42 from metal member 2 that are traveling to metal number 1.

The two carrier dual injector apparatus with a series stack of insulator layers may be utilized to provide a read-only-store memory device. The read-only-store (ROS) memory device may be formed by crossing metal lines which would have either the stacked insulator between them or just a single layer of CVD $SiO_2$ between them. When one of the metals lines is biased to the appropriate voltage, the current would flow between the lines where they are crossed and separated by the stacked insulators incorporating the two carrier dual injector structure, while no current would flow between the lines that are separated by $SiO_2$. Since read-only-store (ROS) memory devices may be read approximately $10^{13}$ times in a very short time interval it would be necessary that space charge effects in the stacked insulators be stable after the first few cycles. Furthermore, if the top metal line (for example, metal number 1 (gate 12) in FIG. 1) is biased positively for all read operations, the top insulating layer must inject holes while the bottom insulating layer (metal number 2 (gate 20) in FIG. 1, which must be negatively biased) must inject electrons. For a further enhancement of the particular embodiment of the present invention, insulating layer materials which predominantly favor hole injection may be used for the top injector while those insulating layer materials which predominantly favor electron injection may be used for the bottom injector with the $SiO_2$ layer again separating them.

Although the invention has been described with reference to a particular embodiment, it will be understood to those skilled in the art that the invention is capable of a variety of alternative embodiments within the spirit and scope of the appended claims.

What is claimed is:

1. A two carrier dual injector semiconductor apparatus for simultaneously injecting electrons and holes therein, comprising in combination:
   a first gate means for injecting either electrons or holes
   a first insulator layer formed adjacent to and in electrical contact with said first gate means to provide an interface therewith,
   a base insulator material formed adjacent to and in electrical contact with said first insulator layer,
   a second insulator layer formed adjacent to and in electrical contact with said base insulator material, said first and second insulator, and base insulator material forming a stacked insulator material, said first and second insulator comprising a different insulator material than said base insulator material and,
   a second gate means for injecting either electrons or holes into said second insulator layers, said first and second gates means respectively simultaneously injecting holes and electrons into said insulator materials, said holes and electrons respectively annihilating charges of opposite sign that are trapped within said insulator materials to provide a stable trapped space charge therein.

2. A two-carrier dual injector semiconductor apparatus as described in claim 1 wherein said first and second insulator layers pass either electrons or holes.

3. A two-carrier dual injector semiconductor apparatus as described in claim 1 wherein said first gate means is biased positively and said second gate means is biased negatively.

4. A two-carrier dual injector semiconductor apparatus as described in claim 1 wherein said first gate means is biased negatively and said second gate means is biased positively.

5. A two-carrier dual injector semiconductor apparatus as described in claim 1 wherein said first and second insulator layers comprises silicon nitride and said base insulator material comprises silicon dioxide.

6. A two-carrier dual injector semiconductor apparatus as described in claim 1 wherein said first and second gate means comprise aluminum.

* * * * *